(12) United States Patent
Matsunaga

(10) Patent No.: US 10,314,161 B2
(45) Date of Patent: Jun. 4, 2019

(54) CIRCUIT BOARD AND ON-BOARD STRUCTURE OF SEMICONDUCTOR INTEGRATED CIRCUIT

(71) Applicant: Mitsubishi Electric Corporation, Tokyo (JP)

(72) Inventor: Shinji Matsunaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 6 days.

(21) Appl. No.: 15/486,374

(22) Filed: Apr. 13, 2017

(65) Prior Publication Data

US 2017/0318661 A1    Nov. 2, 2017

(30) Foreign Application Priority Data

May 2, 2016  (JP) .................................. 2016-092267

(51) Int. Cl.
| | |
|---|---|
| H05K 1/02 | (2006.01) |
| H01L 23/367 | (2006.01) |
| H01L 23/495 | (2006.01) |
| H05K 1/11 | (2006.01) |
| H05K 1/18 | (2006.01) |
| H05K 3/34 | (2006.01) |

(52) U.S. Cl.
CPC ....... *H05K 1/0209* (2013.01); *H01L 23/3675* (2013.01); *H01L 23/49551* (2013.01); *H05K 1/111* (2013.01); *H05K 1/181* (2013.01); *H05K 3/3421* (2013.01); *H05K 2201/10628* (2013.01); *Y02P 70/611* (2015.11); *Y02P 70/613* (2015.11)

(58) Field of Classification Search
CPC .................................................. H05K 1/0209
See application file for complete search history.

(56) References Cited

U.S. PATENT DOCUMENTS

| | | | |
|---|---|---|---|
| 5,229,091 A | 7/1993 | Buchanan et al. | |
| 7,211,877 B1 * | 5/2007 | Zandman ............ | H01L 21/6835 257/620 |
| 8,062,912 B2 * | 11/2011 | Wang .................. | H01L 23/3677 257/98 |

(Continued)

FOREIGN PATENT DOCUMENTS

| | | |
|---|---|---|
| JP | H1-270336 A | 10/1989 |
| JP | H4-293259 A | 10/1992 |

(Continued)

*Primary Examiner* — David M Sinclair
*Assistant Examiner* — Robert D Brown
(74) *Attorney, Agent, or Firm* — Studebaker & Brackett PC

(57) ABSTRACT

A circuit board, on which a packaged semiconductor integrated circuit is to be mounted, includes a substrate, a heat-dissipating connection pad, and a first open area. The substrate includes a substrate body having a main surface, a metal layer located on the main surface, and an insulating layer located on the metal layer. In the heat-dissipating connection pad, the metal layer is exposed from an opening in the insulating layer. The heat-dissipating connection pad is connectable to a heat-dissipating unit of the semiconductor integrated circuit via a bond. In the first open area, the metal layer is exposed from an opening in the insulating layer located outboard with respect to a periphery of the heat-dissipating connection pad.

10 Claims, 5 Drawing Sheets

(56) References Cited

U.S. PATENT DOCUMENTS

| | | | |
|---|---|---|---|
| 2005/0186769 A1* | 8/2005 | Young | H01L 23/49816 438/612 |
| 2006/0261364 A1 | 11/2006 | Suehiro et al. | |
| 2007/0095471 A1* | 5/2007 | Ito | H01L 23/5385 156/293 |
| 2009/0032941 A1* | 2/2009 | McLellan | H01L 21/563 257/737 |
| 2009/0078455 A1* | 3/2009 | Takakusaki | H05K 1/056 174/260 |
| 2009/0153258 A1* | 6/2009 | Lutz | H03B 5/30 331/156 |
| 2009/0243079 A1* | 10/2009 | Lim | H01L 23/49531 257/691 |
| 2010/0003788 A1* | 1/2010 | Wang | H01L 23/3677 438/118 |
| 2010/0167436 A1* | 7/2010 | Lin | H01L 21/486 438/26 |
| 2010/0289054 A1* | 11/2010 | Lin | H01L 21/486 257/99 |
| 2012/0098115 A1* | 4/2012 | Watanabe | B29C 45/14655 257/690 |
| 2012/0217660 A1* | 8/2012 | Tani | H01L 24/29 257/783 |
| 2013/0069245 A1* | 3/2013 | Uchiyama | H01L 24/24 257/774 |
| 2014/0153172 A1* | 6/2014 | Brist | H05K 3/3436 361/679.02 |
| 2014/0264789 A1* | 9/2014 | Yang | H01L 24/27 257/666 |
| 2015/0303164 A1* | 10/2015 | Chen | H01L 24/32 361/720 |
| 2016/0029491 A1* | 1/2016 | Tomohiro | H01L 25/105 361/767 |
| 2016/0095249 A1* | 3/2016 | Kim | H05K 1/0209 361/707 |
| 2016/0302298 A1* | 10/2016 | Min | H05K 1/0204 |
| 2017/0025342 A1* | 1/2017 | Tseng | H01L 23/49833 |
| 2017/0186677 A1* | 6/2017 | Imafuji | H01L 21/481 |
| 2017/0287805 A1* | 10/2017 | Ozawa | H01L 23/3114 |
| 2017/0358515 A1* | 12/2017 | Murdock | H01L 23/3677 |

FOREIGN PATENT DOCUMENTS

| | | |
|---|---|---|
| JP | H7-245324 A | 9/1995 |
| JP | 2012-238670 A | 12/2012 |
| JP | 2013-247755 A | 12/2013 |
| WO | 2004/082036 A1 | 9/2004 |

\* cited by examiner

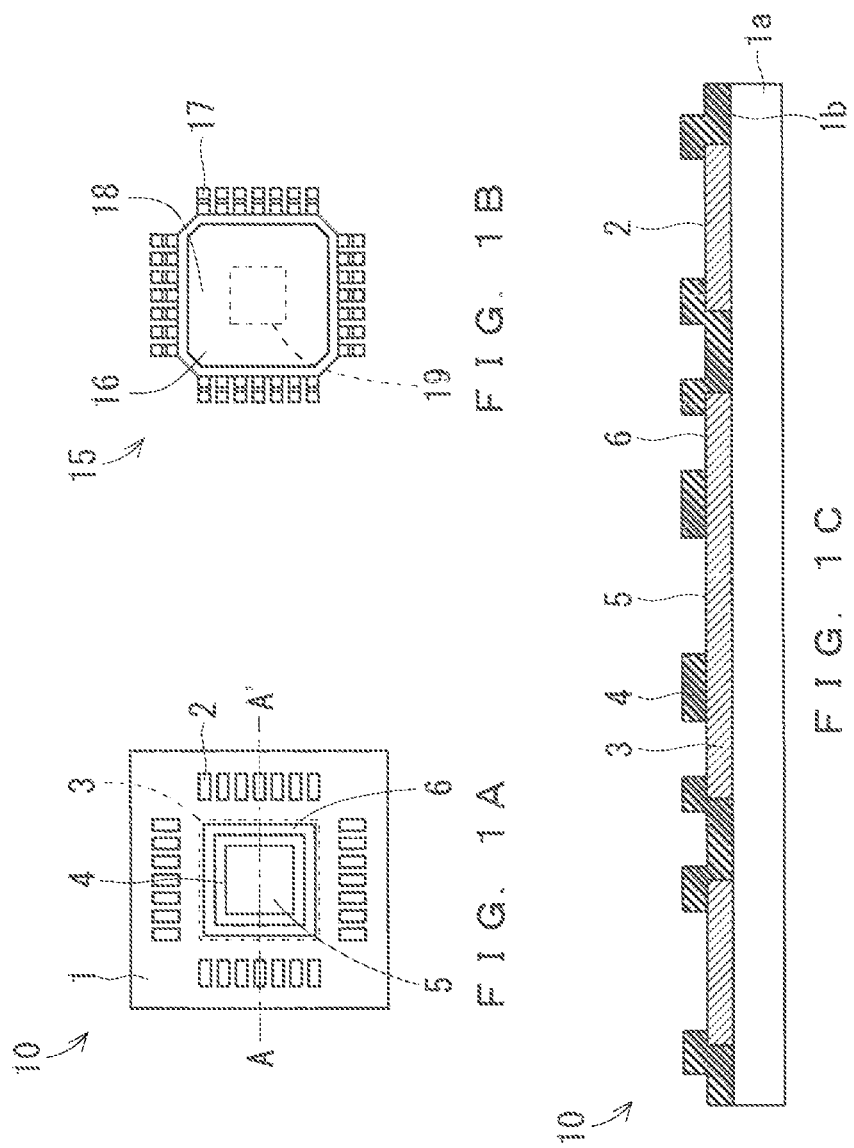

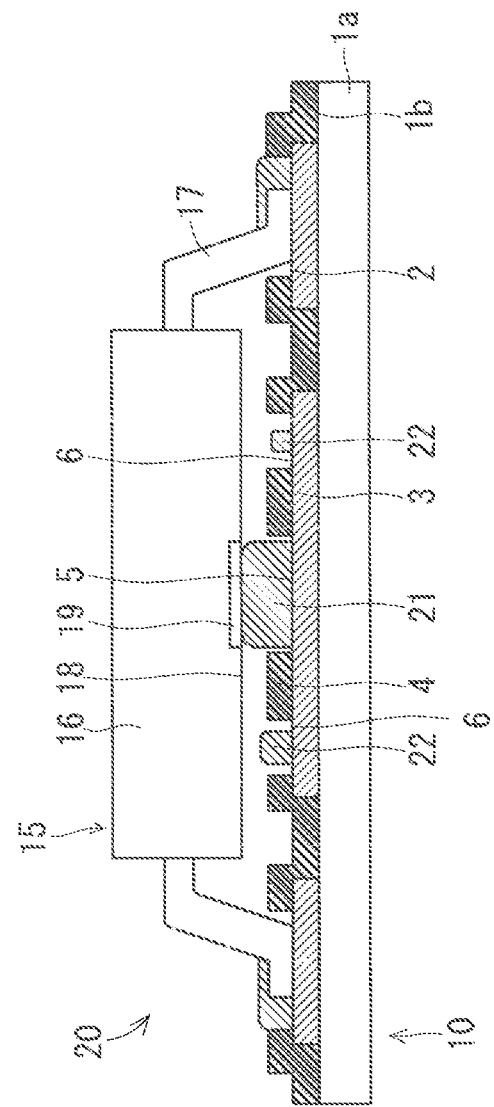
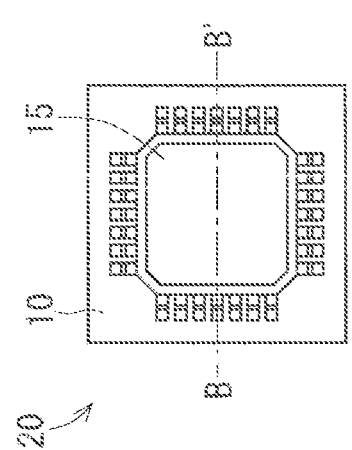
F I G. 2B
F I G. 2A

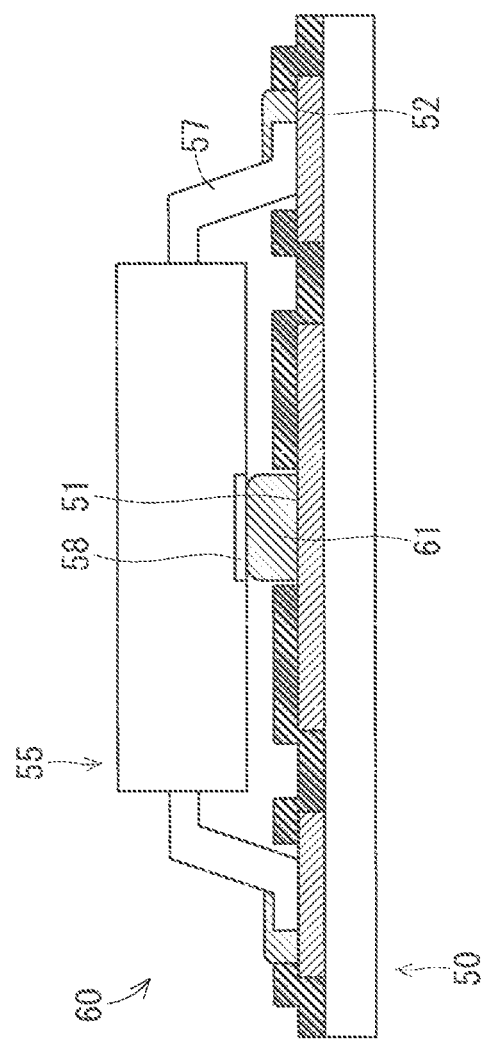
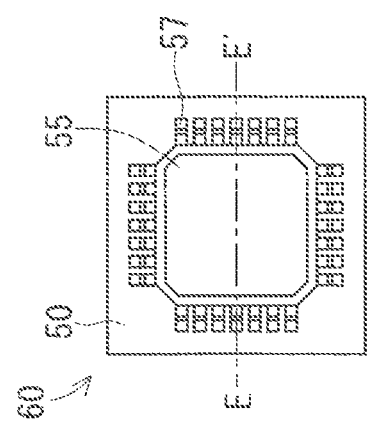

CIRCUIT BOARD AND ON-BOARD STRUCTURE OF SEMICONDUCTOR INTEGRATED CIRCUIT

BACKGROUND OF THE INVENTION

Field of the Invention

The present invention relates to a circuit board and an on-board structure of a semiconductor integrated circuit mounted on the circuit board, and particularly relates to a technique for surface-mounting a semiconductor integrated circuit to a circuit board.

Description of the Background Art

In recent years, semiconductor integrated circuits (ICs) are typically designed to dissipate heat generated by their power consumption through a heat spreader, namely, a heat-dissipating unit located in the rear surface of a package body. The heat spreader is attached or fixed to copper foil on a printed wiring board and dissipates heat generated by a semiconductor chip in the package toward the printed wiring board. Disclosed in Japanese Patent Application Laid-Open No. 2012-238670 is an on-board structure in which a semiconductor package with a heat spreader is bonded to a heat-dissipating land of a wiring board.

FIG. 5A is a plan view of a conventional printed wiring board, namely, a circuit board 50. FIG. 5B is a plan view of a semiconductor IC circuit 55 to be mounted on the circuit board 50. The semiconductor IC circuit 55 includes a package body 56 and leads, namely, terminals 57. In addition, as indicated by the broken line of FIG. 5B, a heat spreader, namely, a heat-dissipating unit 58 is located in the central part of the rear surface of the package body 56. As illustrated in FIG. 5A, the circuit board 50 includes both copper foil, namely, a heat-dissipating connection pad 51 disposed correspondingly to the heat-dissipating unit 58 and terminal connection pads 52 disposed correspondingly to the terminals 57.

To dissipate heat efficiently, the heat spreader needs to be securely bonded to the copper foil on the printed wiring board. FIGS. 6A and 6B each illustrate an on-board structure 60, in which the semiconductor IC circuit 55 is mounted on the circuit board 50. FIG. 6A is a plan view of the on-board structure 60. FIG. 6B is a cross-sectional view taken along the line E-E' of FIG. 6A. The on-board structure 60 includes a bond 61 being solder between the heat-dissipating unit 58 and the heat-dissipating connection pad 51. FIG. 6B illustrates the on-board structure 60 obtained by mounting the semiconductor IC circuit 55 onto the circuit board 50 with the use of the optimal amount of bond 61. The heat-dissipating unit 58 is in direct contact with the bond 61. The bond 61 is in direct contact with the heat-dissipating connection pad 51.

FIG. 6B illustrates the on-board structure 60 obtained with the use of the optimal amount of bond 61. In actuality, however, it is difficult to optimally control the amount of bond 61 to be applied in mounting the semiconductor IC circuit 55 onto the circuit board 50. When the semiconductor IC circuit 55 is placed over the circuit board 50 on a trial basis prior to bonding in the mounting process, there is little clearance between the circuit board 50 and the semiconductor IC circuit 55, and thus, the junction therebetween is physically invisible. The amount of clearance between the circuit board 50 and the semiconductor IC circuit 55 varies with their product-to-product variations.

If the applied bond 61 falls short of the optimal amount, the bonding between the heat-dissipating unit 58 and the bond 61 or the bonding between the bond 61 and the heat-dissipating connection pad 51 would be poor. This can interfere with the thermal conduction from the heat-dissipating unit 58 to the heat-dissipating connection pad 51, thus causing the semiconductor chip to malfunction. Defective products including poorly-bonded components are likely to escape detection at inspections prior to shipment, and possibly get mixed with other products for sale on the market. Increasing the amount of bond 61 to be large enough to avoid the risk of poor bonding may be a workaround to abnormalities such as the poorly-bonded heat spreader. However, an excessive amount of bond 61 may cause the following problems.

The excess bond 61 extends off the heat-dissipating connection pad 51 and the heat-dissipating unit 58 and is pushed forward to the terminals 57 and therearound. The overflow of bond may cause troubles such as a short circuit between the terminals 57. The overflow of bond may be broken down into small particles, which can sometimes move freely in the space surrounded by a circuit board 10, the package body 56, and the terminals 57. Products in which small particles of bond have moved to places free from short circuits can escape detection at the lighting inspection of displays or the like prior to shipment. Thus, defective products can possibly get mixed with other products for sale on the market, as in the event of insufficient application of bond.

SUMMARY OF THE INVENTION

Objects of the present invention are to provide a circuit board whose heat-dissipating connection pad is securely joined to a heat-dissipating unit of a semiconductor IC circuit and to minimize defects by avoiding the use of an excessive amount of bond in joining the heat-dissipating connection pad to the heat-dissipating unit.

A circuit board according to the present invention, on which a packaged semiconductor integrated circuit is to be mounted, includes a substrate, a heat-dissipating connection pad, and a first open area. The substrate includes a substrate body having a main surface, a metal layer located on the main surface, and an insulating layer located on the metal layer. In the heat-dissipating connection pad, the metal layer is exposed from an opening in the insulating layer. The heat-dissipating connection pad is connectable to a heat-dissipating unit of the semiconductor integrated circuit via a bond. In the first open area, the metal layer is exposed from an opening in the insulating layer located outboard with respect to a periphery of the heat-dissipating connection pad.

The heat-dissipating connection pad of the circuit board according to the present invention is securely joined to the heat-dissipating unit of the semiconductor IC circuit and defects can be minimized by avoiding the use of an excessive amount of bond in joining the heat-dissipating pad to the heat-dissipating unit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a plan view of a circuit board according to a first preferred embodiment, FIG. 1B is a plan view of a semiconductor IC circuit according to the first preferred embodiment, and FIG. 1C is a cross-sectional view of the circuit board according to the first preferred embodiment;

FIG. 2A is a plan view of an on-board structure of the semiconductor IC circuit according to the first preferred embodiment and FIG. 2B is a cross-sectional view of the on-board structure of the semiconductor IC circuit according to the first preferred embodiment;

FIG. 6A is a plan view of an on-board structure of the semiconductor IC circuit and FIG. 6B is a cross-sectional view of the on-board structure, according to the prior art.

DESCRIPTION OF THE PREFERRED EMBODIMENTS

Figure 3:
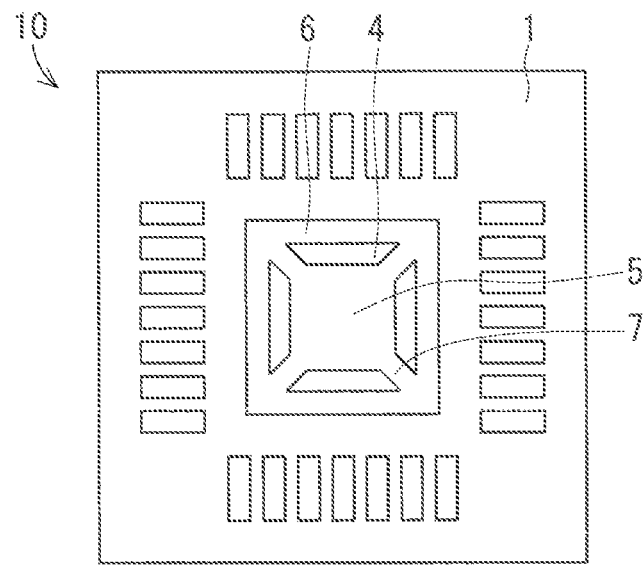
FIG. 3 is a plan view of a circuit board according to a second preferred embodiment.

The following will describe preferred embodiments of a circuit board and an on-board structure of a semiconductor IC circuit mounted on the circuit board according to the present invention.

First Preferred Embodiment

FIG. 1A is a plan view of the circuit board 10 in a first preferred embodiment. FIG. 1B is a plan view of a semiconductor IC circuit 15 in the first preferred embodiment. FIG. 1C is a cross-sectional view of the circuit board 10 taken along the line A-A' of FIG. 1A.

As illustrated in FIG. 1B, the semiconductor IC circuit 15 includes a package body 16 that accommodates a semiconductor chip (not shown) and terminals 17 aligned along at least part of the periphery of the package body 16. The semiconductor IC circuit 15 is a circuit of the surface-mounted quad flat package (QFP) type, with a plurality of leads, namely, the terminals 17 aligned along the four sides of the package body 16.

The semiconductor IC circuit 15 also includes a heat-dissipating unit 19 located in the rear surface thereof, or, in a joint surface 18 (see FIG. 2B), which faces the circuit board 10 having the semiconductor IC circuit 15 mounted thereon. The heat-dissipating unit 19 is to be joined to the circuit board 10 with a bond 21. As illustrated in FIG. 1B, the heat-dissipating unit 19 is located in the central part of the joint surface 18. The heat-dissipating unit 19 is configured to dissipate heat from the package body 16. In the first preferred embodiment, the heat-dissipating unit 19 is a heat spreader.

As illustrated in FIGS. 1A and 1C, the circuit board 10 includes a substrate 1. The substrate 1 includes a substrate body 1a having a main surface 1b, a metal layer 3 laminated on the main surface 1b, and an insulating layer 4 laminated on the metal layer 3. The substrate body 1a is, for example, a single-layer substrate, a multilayer substrate, or a prepreg. The prepreg is made of, for example, carbon fiber, glass fiber, or resin. The circuit board 10 in the first preferred embodiment is a printed wiring board based on a prepreg containing glass fiber and epoxy resin. The metal layer 3 in the first preferred embodiment is copper foil. The insulating layer 4 is made of an insulating material for protecting surfaces of various terminals and wires on the substrate body 1a and preventing them from short-circuiting, and is preferably made of a material based on resin. The insulating layer 4 in the first preferred embodiment is a solder resist.

The circuit board 10 also includes terminal connection pads 2 disposed on the main surface 1b side so as to be connectable to the terminals 17. The positions and shapes of the terminal connection pads 2 vary according to the package type of the semiconductor IC circuit 15 to be mounted on the circuit board 10. The terminal connection pads 2 in the first preferred embodiment are arranged and shaped in accordance with the QFP mentioned above. The terminal connection pads 2 in the first preferred embodiment are made of copper foil.

The circuit board 10 also includes a heat-dissipating connection pad 5 disposed so as to be connectable to the heat-dissipating unit 19 via a bond. In the heat-dissipating connection pad 5, the metal layer 3 is exposed from an opening in the insulating layer 4. As illustrated in FIG. 1A, the heat-dissipating connection pad 5 in the first preferred embodiment has a rectangular shape in a plan view.

In addition, the circuit board 10 includes a first open area 6. In the first open area 6, the metal layer 3 is exposed as the outermost layer of the substrate 1 from an opening in the insulating layer 4 located outboard with respect to the periphery of the heat-dissipating connection pad 5. The first open area 6 is surrounded by the insulating layer 4. In a plan view, the first open area 6 in the first preferred embodiment is shaped in a loop surrounding the perimeter of the heat-dissipating pad 5 at a fixed distance therefrom. The first open area 6 is closer to the terminal connection pads 2 than the heat-dissipating connection pad 5 is.

As illustrated in FIG. 1A, the metal layer 3 extends off the heat-dissipating connection pad 5 and the first open area 6 in a plan view.

The following will describe a mounting step in which the semiconductor IC circuit 15 in FIG. 1B is mounted onto the circuit board 10 in FIG. 1A to obtain an on-board structure 20 of the semiconductor IC circuit in FIGS. 2A and 2B. FIG. 2A is a plan view of the on-board structure 20. FIG. 2B is a cross-sectional view of the on-board structure 20 taken along the line B-B' of FIG. 2A. Reflow soldering is applicable to the mounting process in the first preferred embodiment.

In a first step, a bond is disposed on the heat-dissipating connection pad 5 and the terminal connection pads 2 of the circuit board 10 illustrated in FIG. 1A. In the first preferred embodiment, no bond is disposed on the first open area 6 in the first step. The bond is, for example, solder and contains tin (Sn), gold (Au), lead (Pb), or the like. The bond is disposed by, for example, screen printing. In the first preferred embodiment, solder paste is applied to the heat-dissipating connection pad 5 and the terminal connection pads 2 by screen printing.

In a second step, although not shown in the drawings, the semiconductor IC circuit 15 is placed over the circuit board 10 on a trial basis. The semiconductor IC circuit 15 is subsequently disposed on the circuit board 10 based on this positioning.

In a third step, the circuit board 10 and the semiconductor IC circuit 15 are heated for a predetermined period of time in a reflow furnace and then is cooled. This process is referred to as a "reflow soldering process". In the reflow soldering process in the third step, the solder, namely, the bond melts and then coagulates. Consequently, the terminals 17 are joined to the terminal connection pads 2 with the bond. Also, the heat-dissipating unit 19 is joined to the heat-dissipating connection pad 5 with the bond. Herein, as shown in FIG. 2B, the bond with which the heat-dissipating unit 19 is joined to the heat-dissipating connection pad 5 is denoted by the reference number 21 and is referred to as the bond 21.

The heat-dissipating connection pad 5 shown in FIG. 1A is large so as to be highly thermally conductive. To avoid the risk of poor bonding resulting from the reflow soldering performed with the use of an insufficient amount of bond, the amount of bond to be disposed on the heat-dissipating connection pad 5 in the first step is preferably set to be slightly greater than the optimum amount. During heating in the reflow soldering process in the first preferred embodiment, as illustrated in FIG. 2B, the excess bond flowing out of the heat-dissipating connection pad 5 builds up inside the first open area 6 surrounding the heat-dissipating connection pad 5 and thus does not reach the terminals 17 nor the terminal connection pads 2. Herein, the bond that has built up inside the first open area 6 is denoted by the reference numeral 22 and is referred to as a bond 22.

The on-board structure 20 obtained in the above-mentioned mounting process includes the circuit board 10, the semiconductor IC circuit 15, and the bond 21 located between the heat-dissipating connection pad 5 and the joint surface 18. The bond 21 is joined to the heat-dissipating pad 5 and the heat-dissipating unit 19. The bond 21 is in contact with both the entire surface of the heat-dissipating unit 19 and the entire surface of the heat-dissipating connection pad 5. The on-board structure 20 in the first preferred embodiment also includes the bond 22, which has overflown from the heat-dissipation connection pad 5 and has built up inside at least part of the first open area 6.

Thus, the excess bond, or, the excess solder flowing out of the heat-dissipating connection pad 5 during the reflow soldering in the mounting process builds up inside the first open area 6 surrounding the heat-dissipating connection pad 5. An abnormality such as a short circuit between the terminals 17 is less likely to occur on the circuit board 10 including the first open area 6. In the bonding process with the use of the circuit board 10, the amount of solder to be applied (bond to be disposed) prior to reflow soldering can be greater than the known optimum amount so as to avoid the risk of poor bonding. The margin or the maximum permissible amount of solder to be applied (bond to be disposed) prior to the reflow soldering process can be greater in the circuit board 10 including the first open area 6 than in the conventional circuit board. The amount of bond to be disposed is thus controllable.

As illustrated in FIG. 2B, the bond 21 is securely jointed to the heat-dissipating unit 19 or the joint surface 18 in the resulting on-board structure 20. Thus, the on-board structure 20 including the circuit board 10 can efficiently conduct heat from the semiconductor IC circuit 15 toward the circuit board 10, thus reducing the chances that the semiconductor chip will be overheated and malfunction accordingly.

In the first preferred embodiment, the semiconductor IC circuit 15 includes the heat-dissipating unit 19 located in the joint surface 18 thereof, and the bond 21 in the on-board structure 20 is in contact with the heat-dissipating unit 19. However, the semiconductor IC circuit 15 may include no heat-dissipating unit 19. The heat-dissipating unit 19 may be replaced with a joint of the semiconductor IC circuit 15. The effects of the first preferred embodiment can be produced by the configuration in which the bond 21 in the on-board structure 20 is in direct contact with the joint.

It is not always required that the semiconductor IC circuit 15 be a circuit of the above-mentioned package type. The effects of the first preferred embodiment can be produced by the configuration including, for example, a small outline package (SOP) with leads (the terminals 17) aligned along two side of the package body or a quad flat non-leaded package (QFN) with pads aligned along the four sides of the package body and functioning as the terminals 17 in place of the leads.

To sum up, the circuit board 10 according to the first preferred embodiment, on which the packaged semiconductor IC circuit 15 is to be mounted, includes the substrate 1, the heat-dissipating connection pad 5, and the first open area 6. The substrate 1 includes the substrate body 1a having the main surface 1b, the metal layer 3 located on the main surface 1b, and the insulating layer 4 located on the metal layer 3. In the heat-dissipating connection pad 5, the metal layer 3 is exposed from an opening in the insulating layer 4. The heat-dissipating connection pad 5 is connectable to the heat-dissipating unit 19 of the semiconductor IC circuit 15 via the bond. In the first open area 6, the metal layer 3 is exposed from an opening in the insulating layer 4 located outboard with respect to the periphery of the heat-dissipating connection pad 5. In this configuration, when the semiconductor IC circuit 15 is mounted onto the circuit board 10, the bond 22 being an overflow from the heat-dissipating connection pad 5 builds up inside the first open area 6 and does not reach the terminals 17 nor the terminal connection pads 2 accordingly. The circuit board 10 having the semiconductor IC circuit 15 mounted thereon can reduce the chances that a short circuit will occur between the terminals 17 or between the terminal connection pads 2 due to the overflow of bond. The circuit board 10, as compared with another circuit board including no first open areas 6, can increase the maximum permissible mount of bond to be disposed in the mounting process, thus enabling control of the amount of bond to be disposed. The circuit board 10 can provide the on-board structure 20 in which the bond 21 is joined securely and solidly to the heat-dissipating unit 19 of the semiconductor IC circuit 15.

The on-board structure 20 of a semiconductor IC circuit according to the first preferred embodiment includes the circuit board 10 and the semiconductor IC circuit 15. The heat-dissipating connection pad 5 of the circuit board 10 is joined to the heat-dissipating unit 19 of the semiconductor IC circuit 15 with the bond 21. Thus, the on-board structure 20 of the semiconductor IC circuit 15 can reduce the chances that a short circuit will occur between the terminals 17 or the terminal connection pads 2 due to the overflow of bond. The on-board structure 20 can efficiently conduct heat from the heat-dissipating unit 19 of the semiconductor IC circuit 15 toward the circuit board 10, thus reducing the chances that the semiconductor chip will be overheated and malfunction accordingly. This can also minimize the chances that defective products, which are at risk of short circuits caused by small movable particles of bond and can escape detection at inspections prior to shipment, will get mixed with other products for sale on the market.

Modifications of First Preferred Embodiment

Unlike the above-mentioned case, the bond may be disposed on the first open area 6 in the first step of the mounting process. That is, solder paste may be applied to the first open area 6 by screen printing in the first step. The amount of bond to be disposed on the first open area 6 is adjusted such that no bond overflows from the first open area 6 toward the terminal connection pads 2 in the reflow soldering process. The first open area 6 of the circuit board 10 bonded to the semiconductor IC circuit 15 has improved solder wettability. An overflow of bond from the heat-dissipating connection pad 5 readily builds up inside the first open area 6. The circuit board 10 can accordingly provide an additional margin of bond to be disposed on the heat-dissipating connection pad 5.

Second Preferred Embodiment

The following will describe the circuit board 10 and the on-board structure 20 of the semiconductor IC circuit 15 according to a second preferred embodiment. The configuration and operation similar to those described in the first preferred embodiment will not be further elaborated here.

FIG. 3 is a plan view of the circuit board 10 in the second preferred embodiment. The circuit board 10 includes second open areas 7 as well as the heat-dissipating connection pad 5 and the first open area 6 mentioned in the first preferred embodiment. In the individual second open area 7, the metal layer 3 is exposed as the outermost layer of the substrate 1 from an opening in the insulating layer 4 located between the heat-dissipating connection pad 5 and the first open area 6. One end of the individual second open area 7 is connected to the heat-dissipating connection pad 5, whereas the other end is connected to the first open area 6. In the second preferred embodiment, each of the second open areas 7 connects the corresponding one of the corners of the heat-dissipating connection pad 5 having a rectangular shape to the corresponding one of the corners of the first open area 6 surrounding the rectangular heat-dissipating connection pad 5 in a loop.

In a case where the amount of bond disposed on the heat-dissipating connection pad 5 in the first step in the mounting process mentioned in the first preferred embodiment is excessive with respect to the optimum amount, an excess bond overflows from the heat-dissipating connection pad 5 in the reflow soldering process in the second step. The second open areas 7 efficiently conduct the overflow of bond to the first open area 6. Consequently, the overflow of bond readily builds up inside the first open area 6. Also, the overflow of bond from the heat-dissipating connection pad 5 can build inside the second open areas 7 as well as inside the first open area 6. The circuit board 10 having this configuration can provide an additional margin of bond to be disposed on the heat-dissipating connection pad 5.

Each of the second open areas 7 in the second preferred embodiment lies on an the extension of a line extending from the center to the corresponding one of the corners of the heat-dissipating connection pad 5. The bond can accordingly spread to the corners of the heat-dissipating connection pad 5, so that the entire surface of the heat-dissipating connection pad 5 is more securely joined to the entire surface of the heat-dissipating unit 19 with the bond.

The circuit board 10 according to the second preferred embodiment also includes the second open areas 7 in which the metal layer 3 is exposed from the openings in the insulating layer 4 located between the heat-dissipating connection pad 5 and the first open area 6. The second open areas 7 connect the heat-dissipating connection pad 5 to the first open area 6. In this configuration, an overflow of bond from the heat-dissipating connection pad 5 is efficiently conducted to the first open area 6 through the second open areas 7 while the semiconductor IC circuit 15 is mounted onto the circuit board 10. The overflow of bond can readily build up inside the first open area 6. Also, the overflow of bond from the heat-dissipating connection pad 5 can build up inside the second open areas 7 as well as inside the first open area 6. The maximum permissible amount of bond to be disposed in the mounting process accordingly becomes greater in the circuit board including the second open areas 7 than in another circuit board including no second open areas 7. The circuit board 10 having the semiconductor IC circuit 15 mounted thereon can reduce the chances that a short circuit will occur between the terminals 17 or between the terminal connection pads 2 due to the overflow of bond.

Third Preferred Embodiment

The following will describe the circuit board 10 and the on-board structure 20 of the semiconductor IC circuit 15 according to a third preferred embodiment. The configuration and operation similar to those described in the first preferred embodiment will not be further elaborated here.

Figure 4:
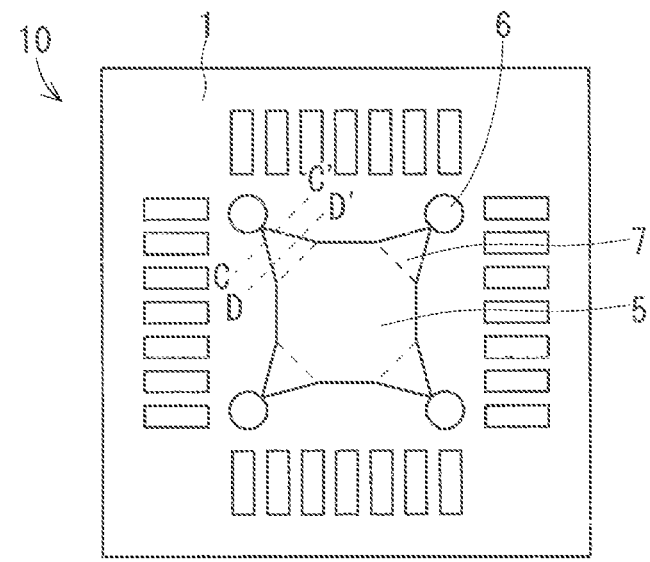
FIG. 4 is a plan view of a circuit board according to a third preferred embodiment.
Figure 5A:
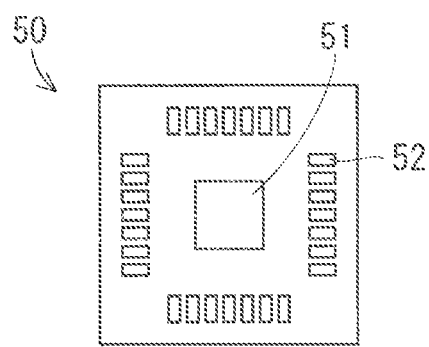
FIG. 5A is a plan view of a circuit board and FIG. 5B is a plan view of a semiconductor IC circuit, according to a prior art.
Figure 5B:
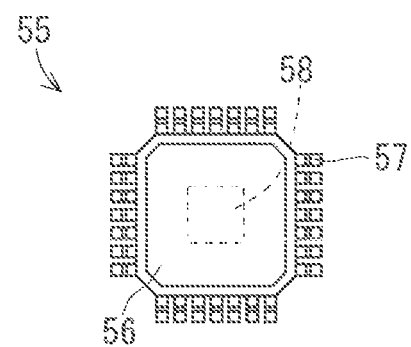

FIG. 4 is a plan view of the circuit board 10 in the third preferred embodiment. The circuit board 10 includes the heat-dissipating connection pad 5 shaped in an octagon. The circuit board 10 also includes the second open areas 7, each of which is a triangle whose base is one of the eight sides of the octagonal heat-dissipating connection pad 5 and is opposed to the base of another triangle, with the apex of each triangle located on a radial line extending from the center of the octagon. In addition, the circuit board 10 includes the first open areas 6, each of which is a circle whose arc includes the apex of the corresponding one of the triangles. Each of the triangular second open areas 7 is connected to the corresponding one of the circular first open areas 6.

The cross-sectional area of the individual second open area 7 perpendicular to a direction extending from the heat-dissipating connection pad 5 toward the individual first open area 6 decreases gradually from the heat-dissipating connection pad 5 toward the first open area 6. Specifically, the area of the cross section of the individual second open area 7 taken along the line C-C' of FIG. 4 is smaller than the area of the cross section taken along the line D-D' of FIG. 4. An overflow of bond from the heat-dissipating connection pad 5 is efficiently and readily conducted, due to capillarity, to the first open areas 6 through the second open areas 7 having the above-mentioned shapes. Consequently, the overflow of bond in the second step can readily build up inside the first open areas 6. Also, the overflow of bond from the heat-dissipating connection pad 5 can build up inside the second open areas 7 as well as inside the first open area 6.

In the third preferred embodiment, the planar pattern including the heat-dissipating connection pad 5, the first open areas 6, and the second open areas 7 has 4-fold rotational symmetry with respect to the center of the heat-dissipating connection pad 5. It is noted that the planar pattern including at least the heat-dissipating connection pad 5 and the first open areas 6 has n-fold rotational symmetry, with n being an integer greater than or equal to 2. The bond is accordingly conducted from the center of the heat-dissipating connection pad 5 toward the first open areas 6 and the second open areas 7. Consequently, the entire surface of the heat-dissipating connection pad 5 is more securely joined to the heat-dissipating unit 19 via the bond.

In the circuit board 10 according to the third preferred embodiment, the cross-sectional area of the individual second open area 7 perpendicular to the direction extending from the heat-dissipating connection pad 5 toward the individual first open area 6 decreases gradually from the heat-dissipating connection pad 5 toward the first open area 6. Thus, when the semiconductor IC circuit 15 is mounted onto the circuit board 10, an overflow of bond from the heat-dissipating connection pad 5 is efficiently and readily conducted to the first open areas 6 due to capillarity in the second open areas 7. Consequently, the overflow of bond can readily build up inside the first open areas 6. Also, the overflow of bond from the heat-dissipating connection pad 5 can build up inside the second open areas 7 as well as inside the first open area 6. The circuit board 10 having the semiconductor IC circuit 15 mounted thereon can provide an on-board structure reducing the chances that a short circuit will occur between the terminals 17 or the terminal connection pads 2 due to the overflow of bond. The circuit board 10, as compared with another circuit board including no second open areas 7, can increase the maximum permissible amount of bond to be disposed in the mounting process.

In the circuit board 10 according to the third preferred embodiment, the planar pattern including the heat-dissipating connection pad 5 and the first open areas 6 on the substrate 1 in a plan view has n-fold rotational symmetry with respect to the center of the heat-dissipating connection pad 5, with n being an integer greater than or equal to 2. Thus, when the semiconductor IC circuit 15 is mounted onto the circuit board 10, an excess bond overflowing radially from the heat-dissipating connection pad 5 can efficiently build up in the first open areas 6 of the circuit board 10.

In the present invention, the above-preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A circuit board on which a packaged semiconductor integrated circuit is to be mounted, said circuit board comprising:
    a substrate including a substrate body having a main surface, a metal layer located on said main surface, and an insulating layer located on said metal layer;
    wherein
    said metal layer includes a heat-dissipating connection pad in which said metal layer is exposed from an opening in said insulating layer, said heat-dissipating connection pad being connectable to a heat-dissipating unit of said semiconductor integrated circuit via a bond;
    said metal layer includes a first open area in which said metal layer is exposed in said insulating layer located outboard at multiple locations with respect to a surrounding periphery of said heat-dissipating connection pad; and
    an exposed portion of said insulating layer exists between said opening and said first open area.

2. A circuit board on which a packaged semiconductor integrated circuit is to be mounted, said circuit board comprising:
    a substrate including a substrate body having a main surface, a metal layer located on said main surface, and an insulating layer located on said metal layer;
    wherein
    said metal layer includes a heat-dissipating connection pad in which said metal layer is exposed from an opening in said insulating layer, said heat-dissipating connection pad being connectable to a heat-dissipating unit of said semiconductor integrated circuit via a bond;
    said metal layer includes a first open area in which said metal layer is exposed in said insulating layer located outboard at multiple locations with respect to a surrounding periphery of said heat-dissipating connection pad;
    said metal layer further includes a second open area in which said metal layer is exposed in said insulating layer located between said heat-dissipating connection pad and said first open area; and
    said second open area connects said heat-dissipating connection pad to said first open area.

3. The circuit board according to claim 2,
    wherein a cross-sectional area of said second open area perpendicular to a direction extending from said heat-dissipating connection pad toward said first open area decreases gradually from said heat-dissipating connection pad toward said first open area.

4. The circuit board according to claim 1,
    wherein a planar pattern including said heat-dissipating connection pad and said first open area on said substrate in a plan view has n-fold rotational symmetry with respect to the center of said heat-dissipating connection pad, n being an integer greater than or equal to 2.

5. An on-board structure of a semiconductor integrated circuit, said structure comprising:
    a circuit board according to claim 1; and
    said semiconductor integrated circuit,
    wherein said heat-dissipating connection pad of said circuit board is joined to said heat-dissipating unit of said semiconductor integrated circuit via said bond.

6. The circuit board according to claim 1,
    wherein said insulating layer includes a first insulating layer portion that extends along a first edge of said heat-dissipating connection pad in a first direction and a second insulating layer portion that extends along a second edge of said heat-dissipating connection pad in a second direction that is transverse to said first direction.

7. The circuit board according to claim 1,
    wherein said first open area extends entirely around said surrounding periphery of said heat-dissipating connection pad.

8. A circuit board on which a packaged semiconductor integrated circuit is to be mounted, said circuit board comprising:
    a substrate including a substrate body having a main surface, a metal layer located on said main surface, and an insulating layer located on said metal layer;
    wherein
    said metal layer includes a heat-dissipating connection pad in which said metal layer is exposed from an opening in said insulating layer, said heat-dissipating connection pad being connectable to a heat-dissipating unit of said semiconductor integrated circuit via a bond;
    said metal layer includes a first open area in which said metal layer is exposed in said insulating layer located outboard at multiple locations with respect to a surrounding periphery of said heat-dissipating connection pad; and
    said metal layer further includes a plurality of second open areas in which said metal layer is exposed in said insulating layer located between said heat-dissipating connection pad and said first open area, such that said second open areas connect said heat-dissipating connection pad to said first open area at different locations with respect to said surrounding periphery of said heat-dissipating connection pad.

9. A circuit board on which a packaged semiconductor integrated circuit is to be mounted, said circuit board comprising:
    a substrate including a substrate body having a main surface, a metal layer located on said main surface, and an insulating layer located on said metal layer;
    wherein
    said metal layer includes a heat-dissipating connection pad in which said metal layer is exposed from an opening in said insulating layer, said heat-dissipating connection pad being connectable to a heat-dissipating unit of said semiconductor integrated circuit via a bond;
    said metal layer includes a first open area in which said metal layer is exposed in said insulating layer located outboard at multiple locations with respect to a surrounding periphery of said heat-dissipating connection pad;

said first open area is configured as a plurality of first open area portions in which said metal layer is exposed in said insulating layer at different locations with respect to said surrounding periphery of said heat-dissipating connection pad; and said metal layer further includes a plurality of second open areas in which said metal layer is exposed in said insulating layer located between said heat-dissipating connection pad and said plurality of first open area portions, such that each of said second open areas connects said heat-dissipating connection pad to a respective one of said first open area portions.

10. The circuit board according to claim 1, wherein said metal layer further includes a terminal connection pad in which said metal layer is exposed from another opening in said insulating layer located outboard with respect to said first open area such that said first open area is between said heat-dissipating connection pad and said terminal connection pad.

\* \* \* \* \*